US012796558B2

(12) United States Patent
Liang et al.

(10) Patent No.: US 12,796,558 B2
(45) Date of Patent: Nov. 10, 2026

(54) SEMICONDUCTOR PACKAGE STRUCTURE

(71) Applicant: MediaTek Singapore Pte. Ltd., Singapore (SG)

(72) Inventors: Chang Liang, Singapore (SG); Zhigang Duan, Singapore (SG); Jubao Zhang, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 428 days.

(21) Appl. No.: 18/413,248

(22) Filed: Jan. 16, 2024

(65) Prior Publication Data

US 2024/0363603 A1 Oct. 31, 2024

Related U.S. Application Data

(60) Provisional application No. 63/498,555, filed on Apr. 27, 2023.

(51) Int. Cl.

| | |
|---|---|
| ***H10W 90/00*** | (2026.01) |
| ***H10W 20/40*** | (2026.01) |
| ***H10W 70/65*** | (2026.01) |
| ***H10W 74/10*** | (2026.01) |
| ***H10W 74/15*** | (2026.01) |

(52) U.S. Cl.

CPC ......... *H10W 90/00* (2026.01); *H10W 20/496* (2026.01); *H10W 70/65* (2026.01); *H10W 74/114* (2026.01); *H10W 90/401* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 2020/0402892 | A1* | 12/2020 | Chen | H10P 72/74 |
| 2021/0305164 | A1* | 9/2021 | Tseng | H10W 70/611 |
| 2022/0028825 | A1* | 1/2022 | Jeng | H10W 70/09 |
| 2023/0062136 | A1* | 3/2023 | Wang | H10D 1/665 |

* cited by examiner

*Primary Examiner* — Molly K Reida

(74) *Attorney, Agent, or Firm* — McClure, Qualey & Rodack, LLP

(57) ABSTRACT

A semiconductor package structure includes a first redistribution layer, a capacitor structure, and a second redistribution layer. The capacitor structure is disposed over the first redistribution layer and includes a semiconductor substrate, a first capacitor cell, a second capacitor cell, and a through via. The first capacitor cell and the second capacitor cell are disposed over the semiconductor substrate and separated by a first scribe line region. The through via is disposed in the first scribe line region. The second redistribution layer is disposed over the capacitor structure and is electrically coupled to the first redistribution layer through the through via.

20 Claims, 4 Drawing Sheets

SEMICONDUCTOR PACKAGE STRUCTURE

CROSS REFERENCE TO RELATED APPLICATIONS

This application claims the benefit of U.S. Provisional Application No. 63/498,555 filed on Apr. 27, 2023, the entirety of which is incorporated by reference herein.

BACKGROUND OF THE INVENTION

Field of the Invention

The present invention relates to semiconductor technology, and, in particular, to a semiconductor package structure including a capacitor structure.

Description of the Related Art

In addition to providing a semiconductor die with protection from environmental contaminants, a semiconductor package structure can also provide electrical connection between the semiconductor die packaged inside it and a substrate such as a printed circuit board (PCB).

As high-performance integrated circuits demand larger currents at higher frequencies with lower power-supply voltages, power system design becomes increasingly challenging. Decoupling capacitors may be used to act as temporary charge reservoirs to prevent momentary fluctuations in supply voltage. These decoupling capacitors are more and more important in reducing the noise caused by power generation.

However, although existing semiconductor package structures generally meet requirements, they have not been satisfactory in every respect. For example, while the dimensions of electronic components such as transistors and resistors are getting smaller, capacitor structures still need to take up more space than other electronic components owing to their physical properties. This may cause IR-related issues. Therefore, further improvements to semiconductor package structures are required.

BRIEF SUMMARY OF THE INVENTION

Semiconductor package structures are provided. An exemplary embodiment of a semiconductor package structure includes a first redistribution layer, a capacitor structure, and a second redistribution layer. The capacitor structure is disposed over the first redistribution layer and includes a semiconductor substrate, a first capacitor cell, a second capacitor cell, and a through via. The first capacitor cell and the second capacitor cell are disposed over the semiconductor substrate and separated by a first scribe line region. The through via is disposed in the first scribe line region. The second redistribution layer is disposed over the capacitor structure and is electrically coupled to the first redistribution layer through the through via.

Another embodiment of a semiconductor package structure includes a capacitor structure and a first semiconductor die. The capacitor structure is has a frontside surface and a backside surface and includes a first capacitor cell, a second capacitor cell, and a through via. The first capacitor cell and the second capacitor cell are separated by a first scribe line region. The through via is disposed in the first scribe line region and extends from the frontside surface to the backside surface. The first semiconductor die is disposed over the capacitor structure and is electrically coupled to the through via.

Yet another embodiment of a semiconductor package structure includes a redistribution layer, a capacitor structure, and a first semiconductor die. The capacitor structure is disposed below the redistribution layer and includes a backside redistribution layer, a first capacitor cell, a second capacitor cell, and a first through via. The first capacitor cell and the second capacitor cell are disposed over the backside redistribution layer and separated by a first scribe line region. The first through via is disposed in the first scribe line region and electrically couples the backside redistribution layer and the redistribution layer. The first semiconductor die is disposed over the redistribution layer and overlaps the capacitor structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
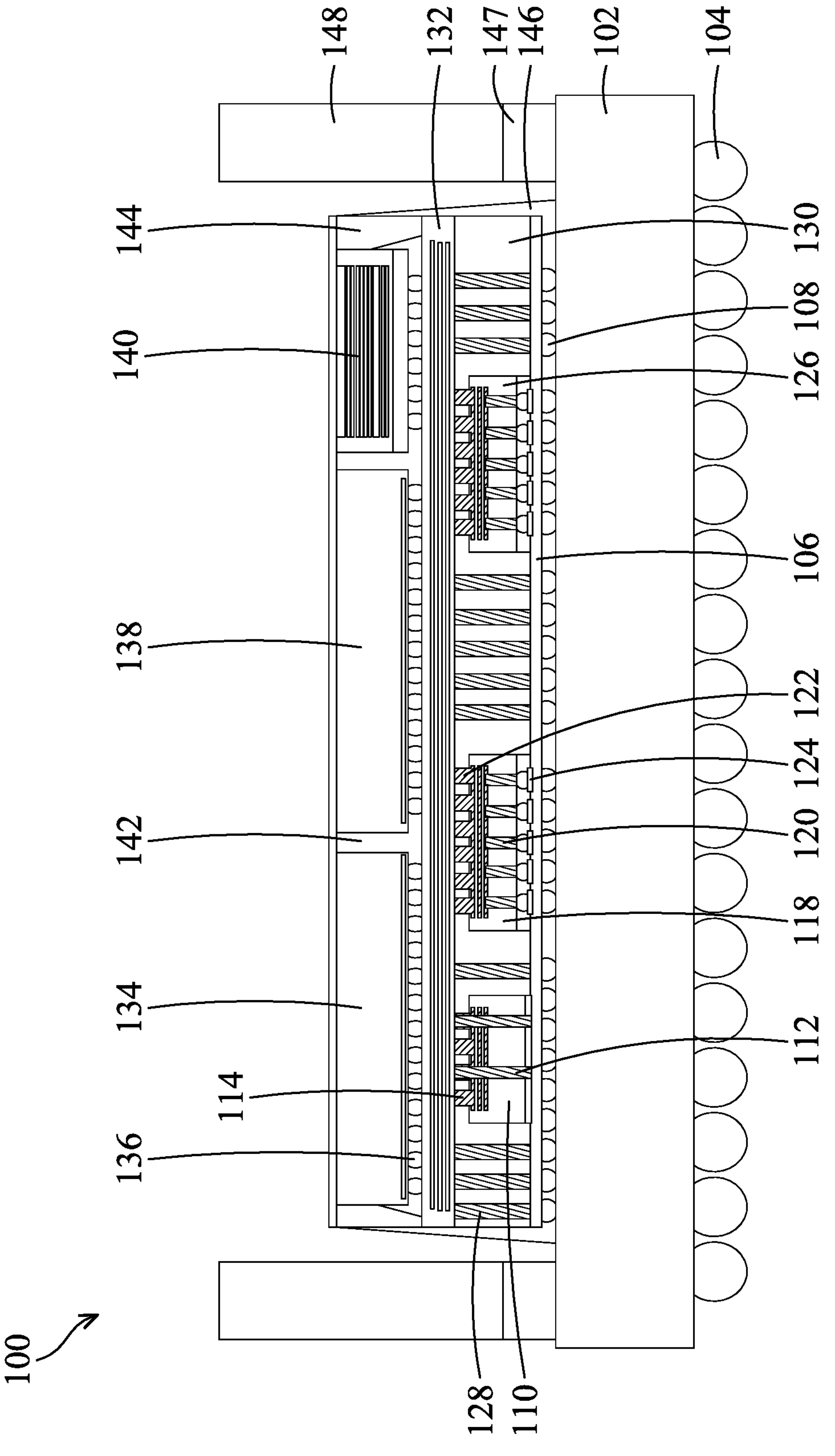
FIG. 1 is a cross-sectional view of an exemplary semiconductor package structure in accordance with some embodiments of the present disclosure.

The following description is made for the purpose of illustrating the general principles of the invention and should not be taken in a limiting sense. The scope of the invention is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

Additional elements may be added on the basis of the embodiments described below. For example, the description of "a first element on/over a second element" may include embodiments in which the first element is in direct contact with the second element, and may also include embodiments in which additional elements are disposed between the first element and the second element such that the first element and the second element are not in direct contact.

Furthermore, the description "a first element extending through a second element" may include embodiments in which the first element is disposed in the second element and extends from a side of the second element to the opposite side of the second element, wherein the surface of the first element may be substantially leveled with the surface of the second element, or the surface of the first element may be outside the surface of the second element.

The spatially relative descriptors of the first element and the second element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A semiconductor package structure including a capacitor structure with a through via is described in accordance with some embodiments of the present disclosure. The through via may be disposed in a scribe line region. Therefore, the route of electrical signals can be shortened, thereby resolving IR-related issues.

FIG. 1 is a cross-sectional view of an exemplary semiconductor package structure 100 in accordance with some embodiments of the present disclosure. Additional features can be added to the semiconductor package structure 100. Some of the features described below can be replaced or eliminated for different embodiments. To simplify the diagram, only a portion of the semiconductor package structure 100 is illustrated.

As illustrated in FIG. 1, the semiconductor package structure 100 includes a package substrate 102, in accordance with some embodiments. The package substrate 102 may include a wiring structure. In some embodiments, the wiring structure includes conductive pads, conductive vias, conductive lines, conductive pillars, the like, or a combination thereof. The wiring structure may be formed of metal, such as tungsten, titanium, tantalum, ruthenium, cobalt, copper, aluminum, platinum, tin, silver, gold, the like, an alloy thereof, or a combination thereof.

The wiring structure may be disposed in dielectric layers. The dielectric layers may also be referred to as inter-metal dielectric (IMD) layers. In some embodiments, the dielectric layers may be formed of organic materials, such as a polymer base material, non-organic materials, including silicon nitride, silicon oxide, silicon oxynitride, the like, or a combination thereof.

The semiconductor package structure 100 includes a plurality of conductive terminals 104 disposed below the package substrate 102 and electrically coupled to the wiring structure of the package substrate 102, in accordance with some embodiments. The conductive terminals 104 may include controlled collapse chip connection (C4) bumps, solder balls, ball grid array (BGA) balls, the like, or a combination thereof. The conductive terminals 104 may be formed of metal, such as nickel, lead, palladium, platinum, tin, silver, gold, the like, an alloy thereof, or a combination thereof.

The semiconductor package structure 100 includes a first redistribution layer 106 disposed over the package substrate 102 and electrically coupled to the wiring structure of the package substrate 102 through a plurality of conductive connectors 108, in accordance with some embodiments. The first redistribution layer 106 may include a wiring structure. In some embodiments, the wiring structure includes conductive pads, conductive vias, conductive lines, conductive pillars, the like, or a combination thereof. The wiring structure may be formed of metal, such as tungsten, titanium, tantalum, ruthenium, cobalt, copper, aluminum, platinum, tin, silver, gold, the like, an alloy thereof, or a combination thereof.

The wiring structure may be disposed in dielectric layers. In some embodiments, the dielectric layers is formed of organic materials, such as a polymer base material, non-organic materials, including silicon nitride, silicon oxide, silicon oxynitride, the like, or a combination thereof.

The conductive connectors 108 may include microbumps, controlled collapse chip connection (C4) bumps, copper pillar bumps, solder balls, ball grid array (BGA) balls, the like, or a combination thereof. The conductive connectors 108 may be formed of metal, such as nickel, lead, palladium, platinum, tin, silver, gold, the like, an alloy thereof, or a combination thereof.

The semiconductor package structure 100 includes a capacitor structure 110 disposed over the first redistribution layer 106, in accordance with some embodiments. The semiconductor package structure 100 includes a second redistribution layer 132 disposed over the capacitor structure 110, in accordance with some embodiments. The second redistribution layer 132 may include a wiring structure disposed in dielectric layers, which may be similar to the dielectric layers and the wiring structure of the first redistribution layer 106, respectively, and will not be described in detail.

The capacitor structure 110 may include one or more through vias 112. The through vias 112 may extend through the capacitor structure 110 and may electrically couple the first redistribution layer 106 and the second redistribution layer 132, so that additional paths can be provided. As a result, the route of electrical signals can be shortened. The through vias 112 may be formed of metal, such as tungsten, titanium, tantalum, ruthenium, cobalt, copper, aluminum, platinum, tin, silver, gold, the like, an alloy thereof, or a combination thereof. The number of through vias 112 is for illustrative purposes only. More or less through vias 112 may be disposed in the capacitor structure 110.

The semiconductor package structure 100 includes a plurality of conductive connectors 114 disposed over the capacitor structure 110, in accordance with some embodiments. The conductive connectors 114 may electrically couple the capacitor structure 110 (including the through vias 112) and the second redistribution layer 132. The conductive connectors 114 may include microbumps, controlled collapse chip connection (C4) bumps, copper pillar bumps, solder balls, ball grid array (BGA) balls, the like, or a combination thereof. The conductive connectors 114 may be formed of metal, such as tungsten, titanium, tantalum, ruthenium, cobalt, copper, aluminum, platinum, tin, silver, gold, the like, an alloy thereof, or a combination thereof.

The semiconductor package structure 100 includes one or more bridge structures 118 and 126 adjacent to the capacitor structure 110 to provide interconnections between semiconductor dies disposed thereon, in accordance with some embodiments. A plurality of through vias 120 may be disposed in the bridge structures 118 and 126. The through vias 120 may extend through the bridge structures 118 and 126 and may electrically couple the first redistribution layer 106 and the second redistribution layer 132. The through vias 120 may be formed of metal, such as tungsten, titanium, tantalum, ruthenium, cobalt, copper, aluminum, platinum, tin, silver, gold, the like, an alloy thereof, or a combination thereof.

The bridge structures 118 and 126 may be electrically coupled to the second redistribution layer 132 through a plurality of conductive connectors 122 and may be electrically coupled to the first redistribution layer 106 through a plurality of conductive connectors 124. The conductive connectors 122 and 124 may be similar to the conductive connectors 114, and will not be repeated.

The semiconductor package structure 100 includes a plurality of conductive pillars 128 adjacent to the capacitor structure 110 and the bridge structures 118 and 126 to electrically couple the first redistribution layer 106 and the second redistribution layer 132, in accordance with some embodiments. The conductive pillars 128 may be formed of metal, such as tungsten, titanium, tantalum, ruthenium, cobalt, copper, aluminum, platinum, tin, silver, gold, the like, an alloy thereof, or a combination thereof.

Some of the conductive pillars 128 may be disposed between the capacitor structure 110 and the bridge structures 118 and between the bridge structures 118 and 126. In the longitudinal direction of the conductive pillars 128, the length of the conductive pillars 128 may be greater than the length of the through vias 112 and may be greater than the length of the through vias 120.

The semiconductor package structure 100 includes a molding material 130 between the first redistribution layer 106 and the second redistribution layer 132, in accordance with some embodiments. The molding material 130 may surround each of the conductive pillars 128, the capacitor structure 110, and the bridge structures 118 and 126 to protect these components from the environment, thereby preventing them from damage due to stress, chemicals, and moisture. The molding material 130 may be formed of a nonconductive material, including moldable polymer, epoxy, resin, the like, or a combination thereof. The sidewalls of the molding material 130 may be substantially coplanar with the sidewalls of the first redistribution layer 106 and the sidewalls of the second redistribution layer 132.

The semiconductor package structure 100 includes a first semiconductor die 134, a second semiconductor die 138, and a third semiconductor die 140 disposed over the second redistribution layer 132, in accordance with some embodiments. The first semiconductor die 134 and the second semiconductor die 138 may be arranged on opposite sides of the bridge structure 118. The first semiconductor die 134 and the second semiconductor die 138 may each partially overlap the bridge structure 118 and may be electrically coupled to each other through the second redistribution layer 132 and the bridge structure 118.

Similarly, the second semiconductor die 138 and the third semiconductor die 140 may be arranged on opposite sides of the bridge structure 126. The second semiconductor die 138 and the third semiconductor die 140 may each partially overlap the bridge structure 126 and may be electrically coupled to each other through the second redistribution layer 132 and the bridge structure 126.

In some embodiments, the first semiconductor die 134, the second semiconductor die 138, and the third semiconductor die 140 each independently includes a system-on-chip (SoC) die, a logic device, a memory device, a radio frequency (RF) device, the like, or any combination thereof. For example, the first semiconductor die 134, the second semiconductor die 138, and the third semiconductor die 140 may each include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), an application processor (AP) die, an application specific integrated circuit (ASIC) die, the like, or any combination thereof.

The first semiconductor die 134, the second semiconductor die 138, and the third semiconductor die 140 may include the same or different devices. For example, the first semiconductor die 134 and the second semiconductor die 138 may include SoC dies, and the third semiconductor die 140 may include a HBM die. It should be noted that three semiconductor dies are for illustrative purposes only, more than three semiconductor dies and/or one or more passive components (such as resistors, capacitors, or inductors) may be disposed over the second redistribution layer 132.

The first semiconductor die 134, the second semiconductor die 138, and the third semiconductor die 140 may be electrically coupled to the second redistribution layer 132 through a plurality of conductive connectors 136. The conductive connectors 136 may include microbumps, controlled collapse chip connection (C4) bumps, copper pillar bumps, solder balls, ball grid array (BGA) balls, the like, or a combination thereof. The conductive connectors 136 may be formed of metal.

An underfill material 142 is formed over the second redistribution layer 132, in accordance with some embodiments. The underfill material 142 may surround each of the conductive connectors 136 to provide structural support. The underfill material 142 may extend between the first semiconductor die 134 and the second semiconductor die 138, and between the second semiconductor die 138 and the third semiconductor die 140. In some embodiments, the underfill material 142 includes polymer, such as epoxy or another suitable material. The underfill material 142 may be dispensed with capillary force, and then may be cured through another suitable curing process.

The semiconductor package structure 100 includes a molding material 144 disposed over the second redistribution layer 132, in accordance with some embodiments. The molding material 144 may surround the first semiconductor die 134, the second semiconductor die 138, the third semiconductor die 140, and the underfill material 142. The sidewalls of the molding material 144 may be substantially coplanar with the sidewalls of the second redistribution layer 132 and the sidewalls of the molding material 130. The molding material 144 may include the same or similar materials as that of the molding material 130, and will not be repeated.

An underfill material 146 is formed over the package substrate 102, in accordance with some embodiments. The underfill material 146 may surround each of the conductive connectors 108 and may cover the sidewalls of the molding materials 130, 144, the first redistribution layer 106, and the second redistribution layer 132. In some embodiments, the underfill material 146 includes polymer, such as epoxy or another suitable material. The underfill material 146 may be dispensed with capillary force, and then may be cured through another suitable curing process.

The semiconductor package structure 100 includes a stiffener structure 148 disposed over a periphery of the package substrate 102 to reduce warpage and bending, in accordance with some embodiments. The stiffener structure 148 may be mounted to the package substrate 102 through an adhesive layer 147. The adhesive layer 147 may be formed of polymer or any suitable material, such as epoxy. The stiffener structure 148 may be formed of metal, dielectric material, or any suitable material, such as copper.

Figure 2:
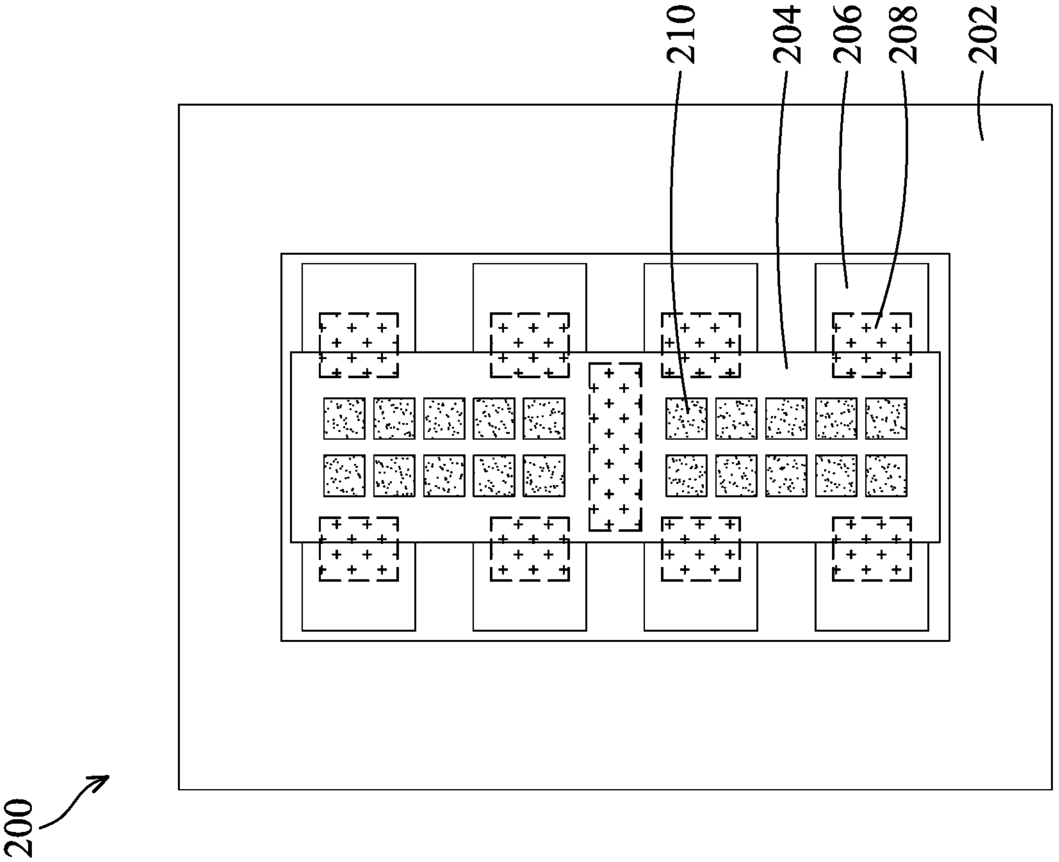
FIG. 2 is a top view of an exemplary semiconductor package structure in accordance with some embodiments of the present disclosure.

FIG. 2 is a top view of a semiconductor package structure 200 in accordance with some embodiments of the present disclosure. It should be noted that the semiconductor package structure 200 may include the same or similar components as that of the semiconductor package structure 100, which is illustrated in FIG. 1, and for the sake of simplicity, those components will not be discussed in detail again.

As shown in FIG. 2, a first semiconductor die 204 and a plurality of second semiconductor dies 206 may be disposed over a package substrate 202. The first semiconductor die 204 and the second semiconductor dies 206 may include the devices similar to the first semiconductor die 134, the second semiconductor die 138, or the third semiconductor die 140 in FIG. 1, and will not be described in detail.

The first semiconductor die 204 and the second semiconductor dies 206 may disposed over a plurality of bridge structures 206. Each one of the bridge structures 208 may be overlapped by adjacent two of the first semiconductor die 204 and the second semiconductor dies 206 to provide interconnections therebetween.

A plurality of capacitor structures 210 may be disposed below the first semiconductor die 204 and may be fully overlapped by the first semiconductor die 204. The capacitor structures 210 may occupy about 30% to about 50% area of the first semiconductor die 204. Compared to the embodiment where the capacitor structures without through vias, at least one of the capacitor structures 210 includes one or more through vias according to the present disclosure can shorten the route of electrical signals to prevent IR-related issues.

Figure 3:
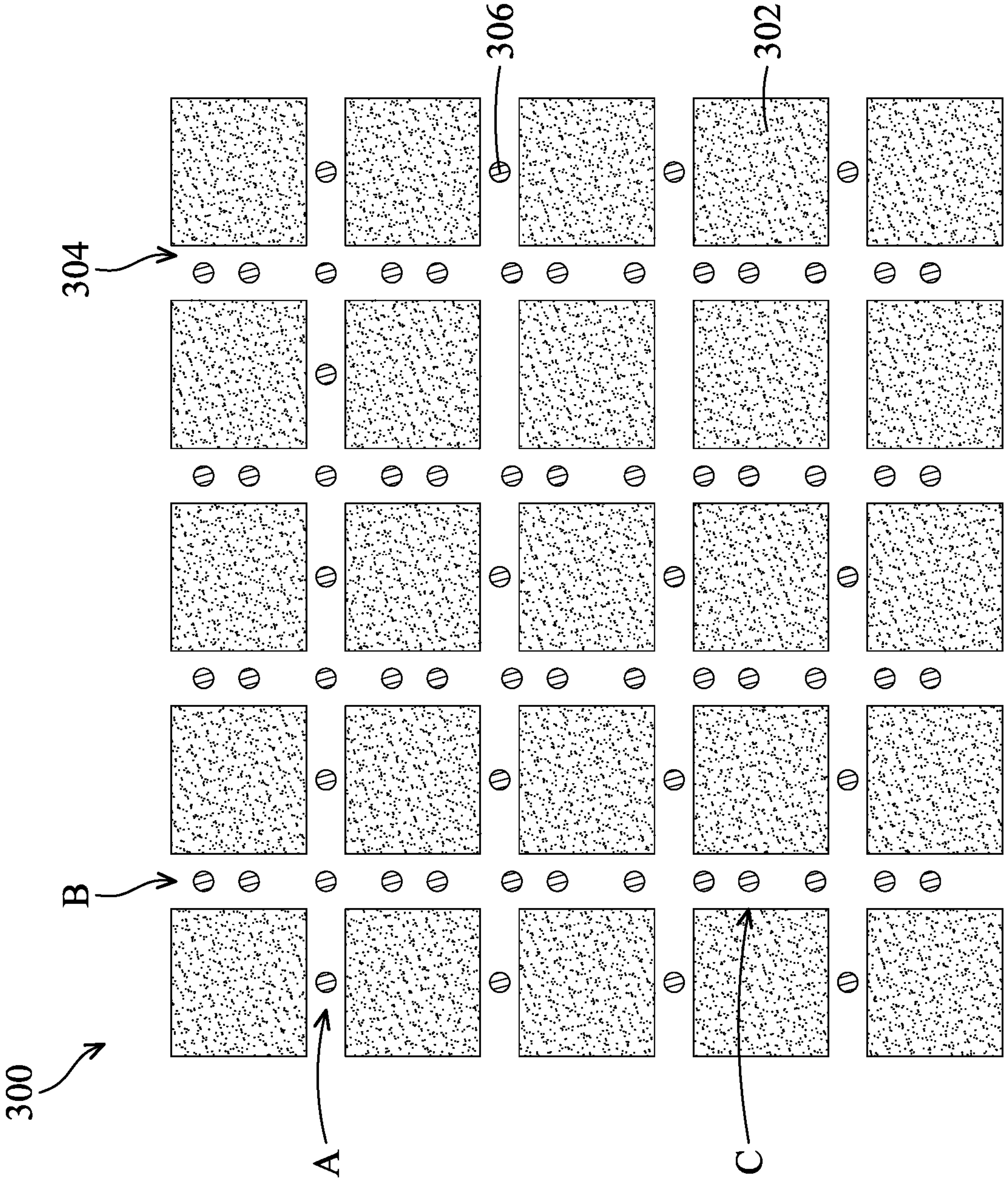
FIG. 3 is a top view of an exemplary capacitor structure in accordance with some embodiments of the present disclosure.

FIG. 3 is a top view of a capacitor structure 300 in accordance with some embodiments of the present disclosure. It should be noted that the capacitor structure 300 may include the same or similar components as that of the capacitor structure 110, which is illustrated in FIG. 1, and for the sake of simplicity, those components will not be discussed in detail again.

As shown in FIG. 3, the capacitor structure 300 includes a plurality of capacitor cells 302, adjacent two of which are separated by a scribe line region 304, in accordance with some embodiments. A plurality of through vias 306 may be disposed in the scribe line regions 304. Since the width of each of the scribe line regions 304 (e.g., about 80 μm) is greater than the diameter of each of the through vias 306 (e.g., about 40 μm), the addition of the through vias 306 is unnecessary to increase the volume of the capacitor structure 300 or remove some capacitor cells. That is, the occupied area would not be increased and the capacitance value would not be reduced.

In addition, it is flexible to select size of the capacitor structure 300 with the through vias 306 to meet difference demanding. Furthermore, the through vias 306 can contact the capacitor cells 302, thereby reducing equivalent series inductance (ESL) and equivalent series resistance (ESR).

It should be noted that the number of through vias 306 is for illustrative purposes only, and the present disclosure is not limited thereto. For example, as indicated by the arrow A, one through via 306 may be disposed between two capacitor cells 302; as indicated by the arrow B, two through vias 306 may be disposed between two capacitor cells 302; and as indicated by the arrow C, three through vias 306 may be disposed between two capacitor cells 302. The through vias 306 may also be disposed diagonally between two capacitor cells 302.

Figure 4:
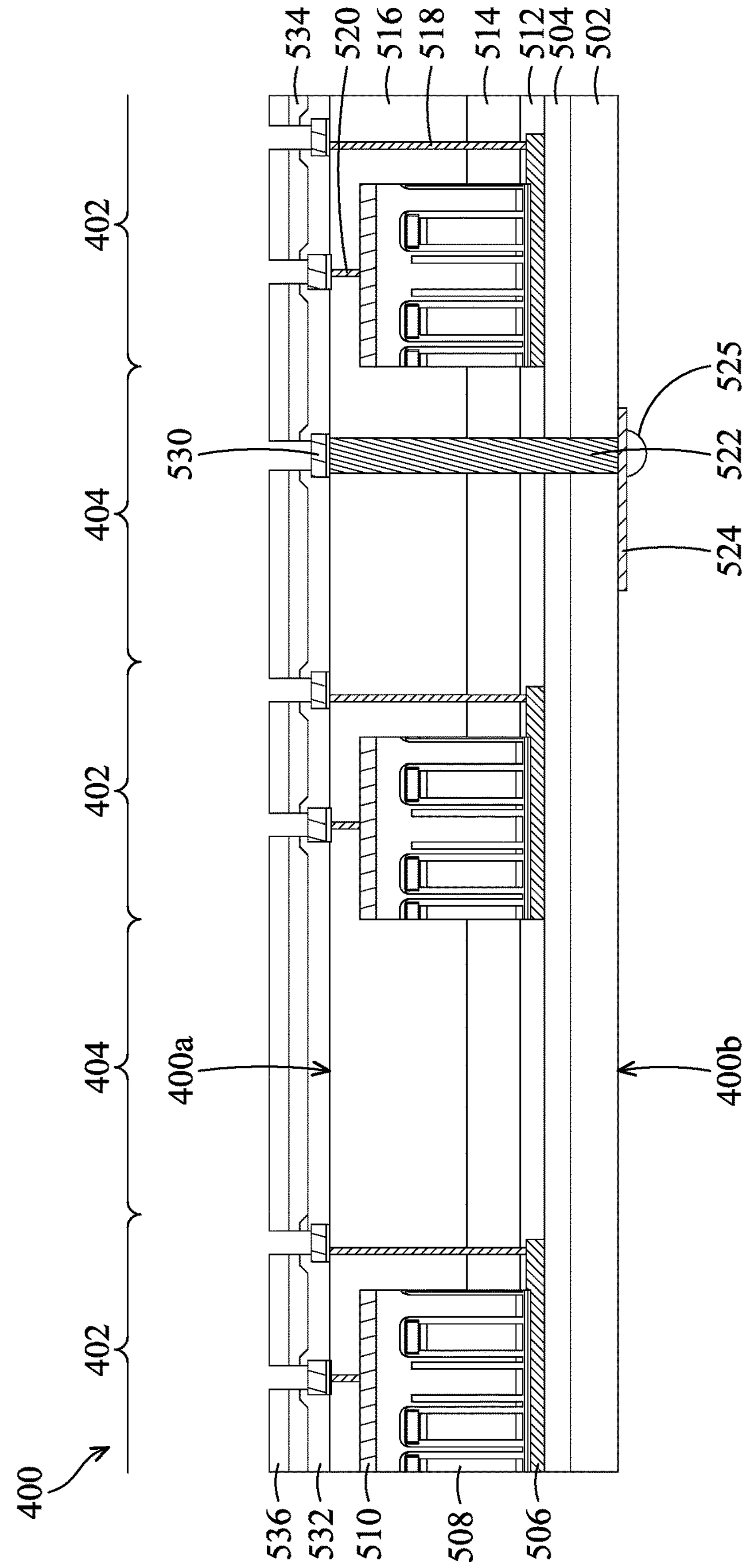
FIG. 4 is a cross-sectional view of an exemplary capacitor structure in accordance with some embodiments of the present disclosure.

FIG. 4 is a cross-sectional view of an exemplary capacitor structure in accordance with some embodiments of the present disclosure. It should be noted that the capacitor structure 400 may include the same or similar components as that of the capacitor structure 110, which is illustrated in FIG. 1, and for the sake of simplicity, those components will not be discussed in detail again.

As shown in FIG. 4, the capacitor structure 400 includes a plurality of capacitor cell region 402 separated by scribe line regions 404, in accordance with some embodiments. The capacitor structure 400 may have a frontside surface 400*a* and a backside surface 400*b* opposite the frontside surface 400*a*.

The capacitor structure 400 may include a semiconductor substrate 502. The semiconductor substrate 502 may be formed of any suitable semiconductor material, such as silicon, germanium, silicon carbon, silicon germanium, gallium arsenide, indium arsenide, indium phosphide, the like, or a combination thereof. The semiconductor substrate 502 may include a bulk semiconductor or a composite substrate formed of different materials. The semiconductor substrate 502 may include a semiconductor-on-insulator (SOI) substrate formed by a semiconductor material on an insulating layer, such as a silicon-on-insulator substrate.

The semiconductor substrate 502 may be doped (e.g., using p-type or n-type dopants) or undoped. Any desired semiconductor elements (including active elements and/or passive elements) may be formed in and on the semiconductor substrate 502. However, in order to simplify the figures, only the flat semiconductor substrate 502 is illustrated. In some embodiments, an insulating layer 504 is disposed over the semiconductor substrate 502. The insulating layer 504 may be formed of oxide, such as silicon oxide.

The capacitor structure 400 includes a plurality of sets of a first metal layer 506, a capacitor cell 508, and a second metal layer 510 disposed over the insulating layer 504, in accordance with some embodiments. The first metal layer 506 and the second metal layer 510 may be disposed on opposite surfaces of the capacitor cell 508. Each set of the first metal layer 506, the capacitor cell 508, and the second metal layer 510 may be disposed in each of the capacitor cell regions, respectively.

The first metal layer 506 and the second metal layer 510 may each independently be formed of metal, including tungsten, titanium, tantalum, ruthenium, cobalt, copper, aluminum, platinum, tin, silver, gold, the like, an alloy thereof, or a combination thereof. The capacitor cell 508 may include a metal-insulator-metal (MIM) capacitor. Opposite sidewalls of the first metal layer 506 may be aligned with opposite sidewalls of the capacitor cell 508. The second metal layer 510 may have a sidewall outside of a sidewall of the capacitor cell 508, and a sidewall aligned with another sidewall of the capacitor cell 508.

A plurality of dielectric layers 512, 514, and 516 are formed over the insulating layer 504, in accordance with some embodiments. The dielectric layers 512, 514, and 516 may surround the first metal layers 506, the capacitor cells 508, and the second metal layers 510. The dielectric layers 512, 514, and 516 may each be formed of dielectric materials, including silicon oxide, silicon nitride, silicon oxynitride, tetraethylorthosilicate (TEOS) oxide, un-doped silicate glass (USG), doped silicate glass (e.g., borophosphosilicate glass (BPSG)), the like, or a combination thereof. The dielectric layers 512, 514, and 516 may include the same or different materials, and the interfaces therebetween may not exist when including the same material.

A plurality of conductive vias 518 and 520 extend through the dielectric layers 512, 514, and 516, in accordance with some embodiments. The conductive vias 518 and 520 may each be formed of metal, including tungsten, titanium, tantalum, ruthenium, cobalt, copper, aluminum, platinum, tin, silver, gold, the like, an alloy thereof, or a combination thereof.

The conductive via 518 may be electrically coupled to the first metal layer 506, and the conductive via 520 may be electrically coupled to the second metal layer 510. In the direction vertical to the top surface of the semiconductor substrate 502, the length of the conductive via 518 may be greater than the length of the conductive via 520 and may be greater than the length of the capacitor cell 508.

One or more through vias 522 are formed in one or more the scribe line regions 404, in accordance with some embodiments. Not every scribe line regions 404 should include the through vias 522. For example, the through vias 522 may be disposed in one of the scribe line regions 404, and the other scribe line region 404 may not have a through via. The through vias 522 may extend from the frontside surface 400*a* to the backside surface 400*b*.

The through vias 522 may be formed by forming one or more openings through the dielectric layers 512, 514, 516, the insulating layer 504, and the semiconductor substrate 502, and then filling the openings with one or more conductive materials using a deposition process. The conductive materials may be metal, including tungsten, titanium, tantalum, ruthenium, cobalt, copper, aluminum, platinum, tin, silver, gold, the like, an alloy thereof, or a combination thereof.

At the frontside surface 400*a*, the top surfaces of the through vias 522 may be substantially coplanar with the top surfaces of the conductive vias 518 and 520. The length of the through via 522 may be greater than the length of the conductive via 518 and may be greater than the length of the conductive via 520. The width of the through via 522 may be greater than the width of the conductive via 518 and may be greater than the width of the conductive via 520.

A backside redistribution layer 524 is formed on the backside surface 400*b*, in accordance with some embodiments. The backside redistribution layer 524 may include a wiring structure electrically coupling to the through vias 522. In some embodiments, the wiring structure includes conductive pads, conductive vias, conductive lines, conductive pillars, the like, or a combination thereof. The wiring structure may be formed of metal, such as tungsten, titanium, tantalum, ruthenium, cobalt, copper, aluminum, platinum, tin, silver, gold, the like, an alloy thereof, or a combination thereof.

The wiring structure may be disposed in dielectric layers. In some embodiments, the dielectric layers is formed of organic materials, such as a polymer base material, non-organic materials, including silicon nitride, silicon oxide, silicon oxynitride, the like, or a combination thereof.

In some embodiments, the backside redistribution layer 524 is disposed locally within the scribe line region 404 with the through vias 522. In particular, the backside redistribution layer 524 may cover the bottom surface of the semiconductor substrate 502 in the scribe line region 404 with the through vias 522 while the bottom surface of the semiconductor substrate 502 in the scribe line region 404 without the through vias 522 and the bottom surface of the semiconductor substrate 502 in the capacitor cell regions 402 may be exposed.

One or more conductive connectors 525 may be formed on the backside redistribution layer 524, and they may be electrically coupled the backside redistribution layer 524 and the redistribution layer disposed underneath (such as the first redistribution layer 106 illustrated in FIG. 1). The conductive connectors 525 may include microbumps, controlled collapse chip connection (C4) bumps, solder balls, ball grid array (BGA) balls, the like, or a combination thereof. The conductive connectors 525 may be formed of metal, such as nickel, lead, palladium, platinum, tin, silver, gold, the like, an alloy thereof, or a combination thereof.

A plurality of conductive pads 530 may be formed on the frontside surface 400*a* and may be electrically coupled to the through via 522, the conductive vias 518 and 520. The conductive pads 530 may be formed of metal, including tungsten, titanium, tantalum, ruthenium, cobalt, copper, aluminum, platinum, tin, silver, gold, the like, an alloy thereof, or a combination thereof.

A plurality of dielectric layers 532, 534, and 536 are formed on the frontside surface 400*a*, in accordance with some embodiments. The dielectric layers 532, 534, and 536 may each be formed of dielectric materials, including silicon oxide, silicon nitride, silicon oxynitride, polyimide, tetraethylorthosilicate (TEOS) oxide, un-doped silicate glass (USG), doped silicate glass (e.g., borophosphosilicate glass (BPSG)), the like, or a combination thereof. The dielectric layers 532, 534 and 536 may include the same or different materials. For example, the dielectric layer 532 may be formed of TEOS oxide, the dielectric layer 534 may be formed of silicon oxynitride, and the dielectric layer 536 may be formed of polyimide.

The dielectric layer 532 may cover the sidewalls of the conductive pads 530, and may partially cover the top surfaces of the conductive pads 530. In particular, the top surface of the dielectric layer 532 may be uneven in the regions with the conductive pads 530. In the regions without the conductive pads 530, such as the scribe line region 404 without the through vias 522, the top surface of the dielectric layer 532 may be flat.

In order to provide a flat top surface, the thickness of the dielectric layer 534 in the regions with the conductive pads 530 may be different (i.e., thinner) than in other regions. That is, in the regions without the conductive pads 530, such as the scribe line region 404 without the through vias 522, the thickness of the dielectric layer 534 may be substantially the same.

A plurality of conductive connectors (such as the conductive connectors 114 illustrated in FIG. 1) may be formed in the dielectric layers 532, 534 and 536 and may be electrically coupled the conductive pads 530 and the redistribution layer disposed thereon (such as the second redistribution layer 132 illustrated in FIG. 1). The conductive connectors may include microbumps, controlled collapse chip connection (C4) bumps, copper pillar bumps, solder balls, ball grid array (BGA) balls, the like, or a combination thereof.

In summary, the semiconductor package structure according to the present disclosure includes a capacitor structure with a through via in a scribe line region. As a result, additional paths for electrical signals can be provided without increasing the volume of the capacitor structure or reducing the capacitance value. IR-related issues can thus be resolved. In addition, it is flexible to select size of the capacitor structure meet difference demanding. Equivalent series inductance (ESL) and equivalent series resistance (ESR) can be reduced as well.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:

a first redistribution layer;

a capacitor structure disposed over the first redistribution layer and comprising:

a semiconductor substrate;

a first capacitor cell and a second capacitor cell disposed over the semiconductor substrate and separated by a first scribe line region; and a through via disposed in the first scribe line region; and a second redistribution layer disposed over the capacitor structure and electrically coupled to the first redistribution layer through the through via.

2. The semiconductor package structure as claimed in claim 1, further comprising:

a bridge structure adjacent to the capacitor structure; and a first semiconductor die and a second semiconductor die disposed over the second redistribution layer and electrically coupled to each other through the bridge structure.

3. The semiconductor package structure as claimed in claim 2, further comprising:

a conductive pillar disposed between the capacitor structure and the bridge structure and electrically coupling the first redistribution layer to the second redistribution layer.

4. The semiconductor package structure as claimed in claim 1, further comprising:

a first molding material disposed between the first redistribution layer and the second redistribution layer; and a second molding material disposed over the second redistribution layer and having a sidewall substantially coplanar with a sidewall of the first molding material.

5. The semiconductor package structure as claimed in claim 4, further comprising:

an underfill material covering the sidewall of the first molding material and the sidewall of the second molding material.

6. The semiconductor package structure as claimed in claim 1, wherein the capacitor structure further comprises:

a third capacitor cell disposed over the semiconductor substrate and separated from the second capacitor cell by a second scribe line region, wherein the second scribe line region does not have a through via.

7. The semiconductor package structure as claimed in claim 6, wherein the capacitor structure further comprises:

a backside redistribution layer covering a bottom surface of the semiconductor substrate in the first scribe line region and exposing the bottom surface of the semiconductor substrate in the second scribe line region.

8. A semiconductor package structure, comprising:

a capacitor structure having a frontside surface and a backside surface and comprising:

a first capacitor cell and a second capacitor cell separated by a first scribe line region; and a through via disposed in the first scribe line region and extending from the frontside surface to the backside surface;

a first semiconductor die disposed over the capacitor structure and electrically coupled to the through via.

9. The semiconductor package structure as claimed in claim 8, further comprising:

a bridge structure adjacent to the capacitor structure; and a first molding material surrounding the bridge structure and the capacitor structure.

10. The semiconductor package structure as claimed in claim 9, further comprising:

a second semiconductor die disposed over the bridge structure and electrically coupled to the first semiconductor die through the bridge structure; and a second molding material surrounding the first semiconductor die and the second semiconductor die.

11. The semiconductor package structure as claimed in claim 8, further comprising:

a plurality of conductive pillars disposed on opposite sides of the capacitor structure and extending in a longitudinal direction of the through via.

12. The semiconductor package structure as claimed in claim 8, wherein the capacitor structure further comprises:

a third capacitor cell separated from the second capacitor cell by a second scribe line region, wherein the second scribe line region does not have a through via.

13. The semiconductor package structure as claimed in claim 8, wherein the capacitor structure further comprises:

a backside redistribution layer disposed on the backside surface and electrically coupled to the through via.

14. The semiconductor package structure as claimed in claim 8, wherein the capacitor structure further comprises:

a plurality of conductive pads disposed on the frontside surface; and a plurality of conductive vias electrically coupling the first capacitor cell and the conductive pads.

15. The semiconductor package structure as claimed in claim 14, wherein a length of the through via is greater than a length of the plurality of conductive vias.

16. The semiconductor package structure as claimed in claim 14, wherein a top surface of the through via is substantially coplanar with a top surface of the plurality of conductive vias.

17. A semiconductor package structure, comprising:

a redistribution layer;

a capacitor structure disposed below the redistribution layer and comprising:

a backside redistribution layer;

a first capacitor cell and a second capacitor cell disposed over the backside redistribution layer and separated by a first scribe line region; and a first through via disposed in the first scribe line region and electrically coupling the backside redistribution layer and the redistribution layer; and a first semiconductor die disposed over the redistribution layer and overlapping the capacitor structure.

18. The semiconductor package structure as claimed in claim 17, further comprising:

a bridge structure adjacent to the capacitor structure and electrically coupled to the redistribution layer; and a second semiconductor die disposed over the redistribution layer, wherein the first semiconductor die and the second semiconductor die partially overlap the bridge structure and are electrically coupled to each other through the bridge structure.

19. The semiconductor package structure as claimed in claim 18, further comprising:

a second through via disposed in the bridge structure and electrically coupled to the redistribution layer.

20. The semiconductor package structure as claimed in claim 17, wherein the capacitor structure further comprises:

a third capacitor cell disposed over the backside redistribution layer and separated from the second capacitor cell by a second scribe line region, wherein the second scribe line region does not have a through via.

* * * * *